United States Patent
Jiang (10) Patent No.: US 7,064,592 B2
(45) Date of Patent: Jun. 20, 2006

(54) METHOD AND APPARATUS FOR NUMERIC OPTIMIZATION OF THE CONTROL OF A DELAY-LOCKED LOOP IN A NETWORK DEVICE

(75) Inventor: Yong H. Jiang, Freemont, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

(21) Appl. No.: 10/845,356

(22) Filed: May 14, 2004

(65) Prior Publication Data

US 2005/0065745 A1 Mar. 24, 2005

Related U.S. Application Data (60) Provisional application No. 60/556,477, filed on Mar. 26, 2004, provisional application No. 60/499,615, filed on Sep. 3, 2003.

(51) Int. Cl.
*H03L 7/00* (2006.01)
(52) U.S. Cl. ........................................ 327/161; 327/158
(58) Field of Classification Search ................ 327/149, 327/158, 161, 276, 277, 284, 202
See application file for complete search history.

(56) References Cited

U.S. PATENT DOCUMENTS

| 5,278,789 | A  |   | 1/1994 | Inoue et al. ............ 365/189.01 |
| 5,742,613 | A  |   | 4/1998 | MacDonald ................ 371/10.3 |
| 5,831,980 | A  |   | 11/1998 | Varma et al. ................ 370/395 |
| 5,892,922 | A  |   | 4/1999 | Lorenz ................... 395/200.68 |
| 6,175,902 | B1 |   | 1/2001 | Runaldue et al. ............ 711/159 |
| 6,570,454 | B1 | * | 5/2003 | Skierszkan ...................... 331/2 |
| 6,721,114 | B1 | * | 4/2004 | Sutardja et al. ................ 360/45 |

FOREIGN PATENT DOCUMENTS

| EP | 0752796 A2 | 1/1997 |
| JP | 4-189023 | 7/1992 |

\* cited by examiner

*Primary Examiner*—Linh My Nguyen
(74) *Attorney, Agent, or Firm*—Squire, Sanders & Dempsey, L.L.P.

(57) ABSTRACT

A method of setting a delay offset in slave Delay-Locked Loop (DLL) modules by a master DLL module is disclosed. The method includes determining whether a delay tap value needs to be adjusted based on a comparison with a reference clock signal, calculating a delay offset value to correct the delay tap value, repeating the determining and calculating steps a predetermined number of times and forwarding a representative value of the calculated delay offset values. The representative value is determined through a comparison between all of the calculated delay offset values obtained in the repeating step.

15 Claims, 5 Drawing Sheets

METHOD AND APPARATUS FOR NUMERIC OPTIMIZATION OF THE CONTROL OF A DELAY-LOCKED LOOP IN A NETWORK DEVICE

REFERENCE TO RELATED APPLICATIONS

This application claims priority of U.S. Provisional Patent Application Ser. No. 60/499,615, filed on Sep. 3, 2003 and U.S. Provisional Patent Application Ser. No. 60/553,122, filed on Mar. 26, 2004. The subject matter of these earlier filed applications is hereby incorporated by reference.

BACKGROUND OF THE INVENTION

1. Field of the Invention

The present invention relates to devices, software applications and networks that utilize data that is sent or received over data communication or computer networks. In particular, the present invention is directed to management and use of memory in a network device to implement certain policies. The processor and methods described provide greater reliability in the use of external memory to process the data sent and received by the network device.

2. Description of Related Art

As computer performance has increased in recent years, the demands on computer networks has significantly increased; faster computer processors and higher memory capabilities need networks with high bandwidth capabilities to enable high speed transfer of significant amounts of data. The well-known Ethernet technology, which is based upon numerous IEEE Ethernet standards, is one example of computer networking technology which has been able to be modified and improved to remain a viable computing technology.

Based upon the Open Systems Interconnect (OSI) 7-layer reference model, network capabilities have grown through the development of repeaters, bridges, routers, and, switches, which operate with various types of communication media. Collectively, with respect to the present invention, all of these may be referred to as network devices. Switches, as they relate to computer networking and to Ethernet, are hardware-based devices which control the flow of datagrams, data packets or cells based upon destination address information which is available in each packet. A properly designed and implemented switch should be capable of receiving a packet and switching the packet to an appropriate output port at the maximum speed capability of the particular network.

Referring to the OSI 7-layer reference model discussed previously, the higher layers typically have more information. Various types of products are available for performing switching-related functions at various levels of the OSI model. Hubs or repeaters operate at layer 1, and essentially copy and "broadcast" incoming data to a plurality of spokes of the hub. Layer 2 switching-related devices are typically referred to as multiport bridges, and are capable of bridging two separate networks. Bridges can create a table of forwarding rules based upon which MAC (media access controller) addresses exist on which ports of the bridge, and pass packets that are destined for an address which is located on an opposite side of the bridge. Bridges typically utilize what is known as the "spanning tree" algorithm to eliminate potential data loops; a data loop is a situation wherein a packet endlessly loops in a network looking for a particular address. The spanning tree algorithm defines a protocol for preventing data loops. Layer 3 switches, sometimes referred to as routers, can forward packets based upon the destination network address. Layer 3 switches are capable of learning addresses and maintaining tables thereof which correspond to port mappings. Processing speed for layer 3 switches can be improved by utilizing specialized high performance hardware, and off loading the host CPU so that instruction decisions do not delay packet forwarding.

In addition, there has also been pressure from the implementers of the computer networks to have network devices to mediate traffic on the computer networks that are extremely flexible and low cost. One aspect of this lower cost can be the use of external memory, i.e. memory that does not natively reside within the network device. A network device may use external memory, at least in part, to temporarily store data that is received by the network device. This allows for the external memory to be switched out, if needed, without requiring revamping of the chip that makes up the network device.

The interface between the network switch and the external memory becomes more important as the throughput for the external memory increases. For example, for external memory such as 200 Mhz Double Data Rate Synchronous Dynamic Random Access Memory (DDR SDRAM), the interface and the memory controller must be able to read and write data at that frequency. In the past, the level of precision with respect to the timing control elements did not have to be as greater to accommodate slower memory.

To accomplish this, a master Delay-Locked Loop (DLL) is used to set the number of delay taps and used to set a 90 degree phase difference that is required by the memory. This is desirable because the clock edge should be centered right in the middle of the window for the memory because that is preferred. The signal from the master DLL is sent to slave DLLs that are populated in the memory channels of the network device. Thus, one command center receives the clock signal, the same clock signal used by the memory, and the proper signals are then used for all of the memory channels. The signal the master DLL sends out, after performing the proper locking, controls up to a 32-bit delay tap in the delay line.

However, as discussed above, problems can occur with the DLL functioning when the memory has a higher throughput and detection and correction must occur at higher speeds. One such problem can occur in that the phase shift must be detected to determine if it is still 90 degrees. As time goes by, the voltages and settings in the network device may shift and other changes may occur. The DLL needs to react to its working environment and automatically change its settings accordingly. One issue is how often to update the slave DLLs. If the update were to occur at every clock cycle, the delay lines would have issues when changing from tap to the next tap. If the slave DLLs are not updated and reset before the next cycle, certain glitches may be introduced. In other words, things may not momentarily be set correctly. The glitches can potentially generate extra clock edges that would be very undesirable to the function of the device.

SUMMARY OF THE INVENTION

According to one embodiment of the invention, a method of setting a delay offset in slave Delay-Locked Loop (DLL) modules by a master DLL module is disclosed. The method includes determining whether a delay tap value needs to be adjusted based on a comparison with a reference clock signal, calculating a delay offset value to correct the delay tap value, repeating the determining and calculating steps a predetermined number of times and forwarding a representative value of the calculated delay offset values. The representative value is determined through a comparison between all of the calculated delay offset values obtained in the repeating step.

Additionally, the step of repeating the determining and calculating steps the predetermined number of times may include repeating the determining and calculating steps over a provided number of clock cycles of the reference clock signal and obtaining the representative value by averaging all of the calculated delay offset values during the provided number of clock cycles. The provided number of clock cycles may be between 32 and 64 clock cycles, or equal to 64 clock cycles.

In addition, the step of repeating the determining and calculating steps may be performed a sufficient number of times to remove effects of low frequency power supply instability from the representative value. Also, the determining, calculating and repeating steps may be performed in the slave DLL modules after the step of forwarding the representative value.

According to another embodiment, a delay offset module for setting a delay offset in slave Delay-Locked Loop (DLL) modules by a master DLL module is disclosed. The delay offset module includes determining means for determining whether a delay tap value needs to be adjusted based on a comparison with a reference clock signal, calculating means for calculating a delay offset value to correct the delay tap value, timing means for measuring a predetermined time period, holding means for holding multiple calculated delay offset values determined by the calculating means over the predetermined time period, representative means for obtaining a representative value of the held calculated delay offset values and forwarding means for forwarding the representative value.

According to another embodiment, a delay offset module for setting a delay offset in slave Delay-Locked Loop (DLL) modules by a master DLL module is disclosed. The delay offset modules includes an adjustment determiner for determining whether a delay tap value needs to be adjusted based on a comparison with a reference clock signal, a calculator for calculating a delay offset value to correct the delay tap value, a timer for measuring a predetermined time period, a holding memory for holding multiple calculated delay offset values determined by the calculating means over the predetermined time period, a representative value calculator for obtaining a representative value of the held calculated delay offset values and a forwarder for forwarding the representative value.

These and other variations of the present invention will be described in or be apparent from the following description of the preferred embodiments.

BRIEF DESCRIPTION OF THE DRAWINGS

For the present invention to be easily understood and readily practiced, the present invention will now be described, for purposes of illustration and not limitation, in conjunction with the following figures.

DETAILED DESCRIPTION OF PREFERRED EMBODIMENTS

Figure 1:
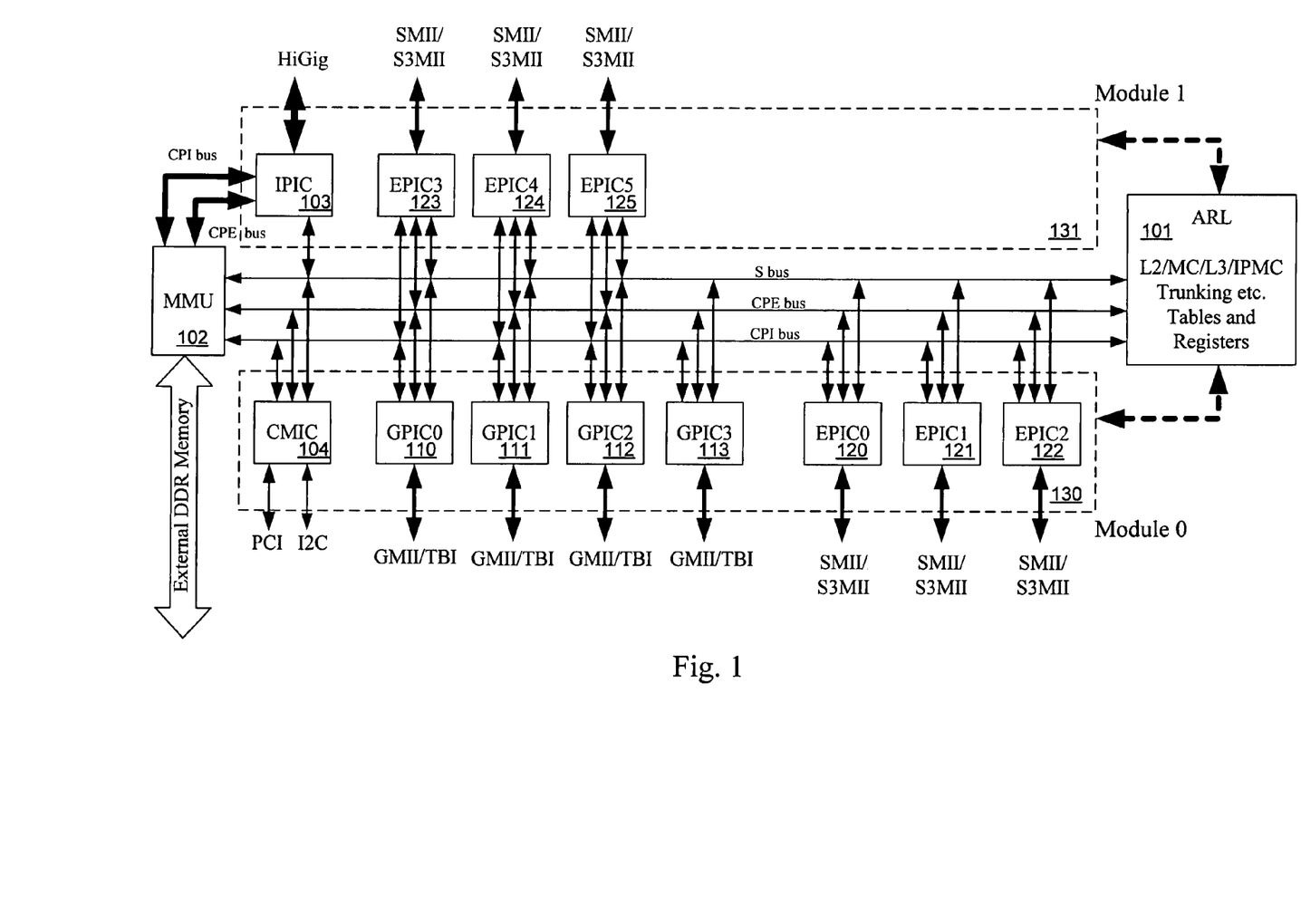
FIG. 1 illustrates a block diagram providing the basic elements of a network device, according to one embodiment of the present invention.

The present invention is directed, in one embodiment, to a network device that receives data and process that data and may forward that data onto a destination based on attributes of that data. A general schematic of the network device is illustrated in FIG. 1. The device has an address resolution module (ARL) 101 that provides support for Layer 2 (L2), Multicast (MC), Layer 3 (L3), Internet Protocol Multicast (IPMC) switching, as well as Trunking, through various tables and registers. The ARL is connected to elements of the network switch divided into different modules. The ARL is also connected through a bus made up of channels, with data transferred on the CPI bus, protocols transferred therewith on the CPE bus and the S bus which is a sideband bus and is used to transfer signals between portions of the network device.

The bus can provide connections between the Memory Management Unit (MMU) and other interface modules. The interface modules include Ethernet Port Interface Controllers (EPICs) 120–125, Gigabit Port Interface Controllers (GPICs) 110–113, Interconnect Port Interface Controller (IPIC) 103, and CPU Management Interface Controller (CMIC) 104. The above components are discussed below. In addition, a Central Processing Unit (CPU) can be used as necessary to program the network device with rules which are appropriate to control packet processing. However, once network device is appropriately programmed or configured, it operates, as much as possible, in a free running manner without communicating with CPU.

As discussed above, the network device can have two module IDs, with module id 0 covering the Gigabit Ethernet ports, the CMIC and EPICs 0 through 2 and with module id 1 covering the IPIC and EPICs 3 through 5. The device may support 16K MAC address with 256 Layer 2 multicast addresses and 4K VLANs. The device also may support 256 multiple spanning trees and 8 levels of Class of Service. The device also supports protocol based VLANs with priority fields and supports jumbo frames. It also supports Layer 2 Multiprotocol Label Switching (MPLS) and supports classification for multiple packet formats, including Ipv6, Ipv4, double tagged, HTLS, 802.1Q tagged, Ether II and 802.3.

The GPIC modules (110–113) can interface to the Gigabit ports and on the medium side it interfaces to the TBI/GMII or MII from 10/100 and on the chip fabric side it interfaces to the bus. Each GPIC supports 1 Gigabit port or a 10/100 Mbps port. Each GPIC performs both the ingress and egress functions. The EPIC modules (120–125) interface to the 10/100-Mbit Ethernet ports and on the medium side it interfaces to the SMII/S3MII and on the chip fabric side it interfaces to the bus. Each GPIC supports an Ethernet port. A standard 802.3u MIIM interface is supported to interface with PHY devices, a standard JTAG interface for boundary scan and an LED interface to control system LEDs.

The IPIC 103 module can interface to the bus on one side and a high speed interface, such as a HIGIG interface, on the other side. The high speed bus can be, for example, is a XAUI interface, providing a total bandwidth of 10 Gbps. The CMIC 104 block is the gateway to the host CPU. In it's simplest form it provides sequential direct mapped accesses between the CPU and the network device. The bus interface may be a 66 MHz PCI. In addition, an I2C (2-wire serial) bus interface may be supported by the CMIC, to accommodate low-cost embedded designs where space and cost are a premium.

The device can also support metering, with a granularity of, for example, 64 kb/s, having bucket sizes between 4 k and 512 k. The device may also include counters based on packet number or bytes, with those counters being in-profile, out-profile or general purpose. The device also allows for rate limiting or shaping. The device includes Ingress per port rate limiting, where when the incoming bandwidth exceed a programmed threshold, the port can either send a pause frame or drop packets. The rate control is on a per port basis and support for Egress per port rate limiting.

Support may also be provided for rapid spanning tree protocol that may be deleted by the port and storm control on a per port basis. The network device may also support link aggregation, with, for example, 32 trunk groups, with up to 8 ports in a trunk group. Trunking is also supported across modules and the load may be distributed based on source MAC or IP address and/or destination MAC or IP address.

The packet buffer memory of the device may include external DDR SDRAM memory with a 128 data bit DDR SDRAM interface, configured as 4 independent channels according to several embodiments. Each channel can include 32 data bits and it own address and control signals. The network device supports 32 MB or 64 MB packet buffer memory size, X16 and X32 DDR SDRAM memory and 166 MHz to 200 MHz clock DDR SDRAM memory. For reliability and signal integrity, there is support for CRC16 on every pointer, CRC5 on every cell and CRC32 on every frame. There is also support for a packet aging mechanism based on packet time stamp.

A fast filtering processor (FFP) can be incorporated into the EPICs and GPICs, in order to accelerate packet forwarding and enhance packet flow. The FFP is essentially a state machine driven programmable rules engine. Filters are applied to packets received by the FFP, through the use of masks so that certain fields of a packet may be evaluated. The filters utilized by FFP are defined by a rules table, where that table is completely programmable by the CPU, through the CMIC. The actions taken based on the filtering of the FFP include 802.1p tag insertion, 802.1p priority mapping, IP TOS (type-of-service) tag insertion, sending of the packet to the CPU, discarding or dropping of the packet and forwarding the packet to an egress port.

The network device may also provide supports for differentiated services. The differentiated services may include metering, per ingress port and per flow, policing, per egress port, re-marking, including DSCP (IPv4 and IPv6) re-marking, re-marking based on inclusive or exclusive matches in the FFP, and classification based on incoming DSCP, and dropping, as a result of metering or filtering. A pulse may be used to refresh all meters across the network device, including ingress metering, FFP metering, egress metering and WFQ MMU meters.

There are several mechanisms for buffering of packets and advanced methods for controlling the flow of packets. These include cell-based Head Of Line (HOL) blocking prevention that is programmable and is based on the total packet memory used by each Class of Service (CoS) per port. Packet-based HOL blocking prevention is also programmable and is based on the number of packets per CoS queue for each port. These mechanisms also support tail drop for CNG for HOL of 25%, 50%, 75% and 100% and supports centralized per port HOL counter. The mechanisms may also address back pressure, per ingress port and per flow through the FFP. The latter includes pause frame support (symmetric and asymmetric IEEE 802.3x) and a jamming mechanism for half-duplex ports. A Weighted Random Early Detection (WRED) congestion control per CoS queue per port is also available. Random Early Detection is a congestion avoidance mechanism that takes advantage of TCP's congestion control mechanism. By randomly dropping packets prior to periods of high congestion, RED tells the packet source to decrease its transmission rate. Assuming the packet source is using TCP, it will decrease its transmission rate until all the packets reach their destination, indicating that the congestion is cleared.

Figure 2:
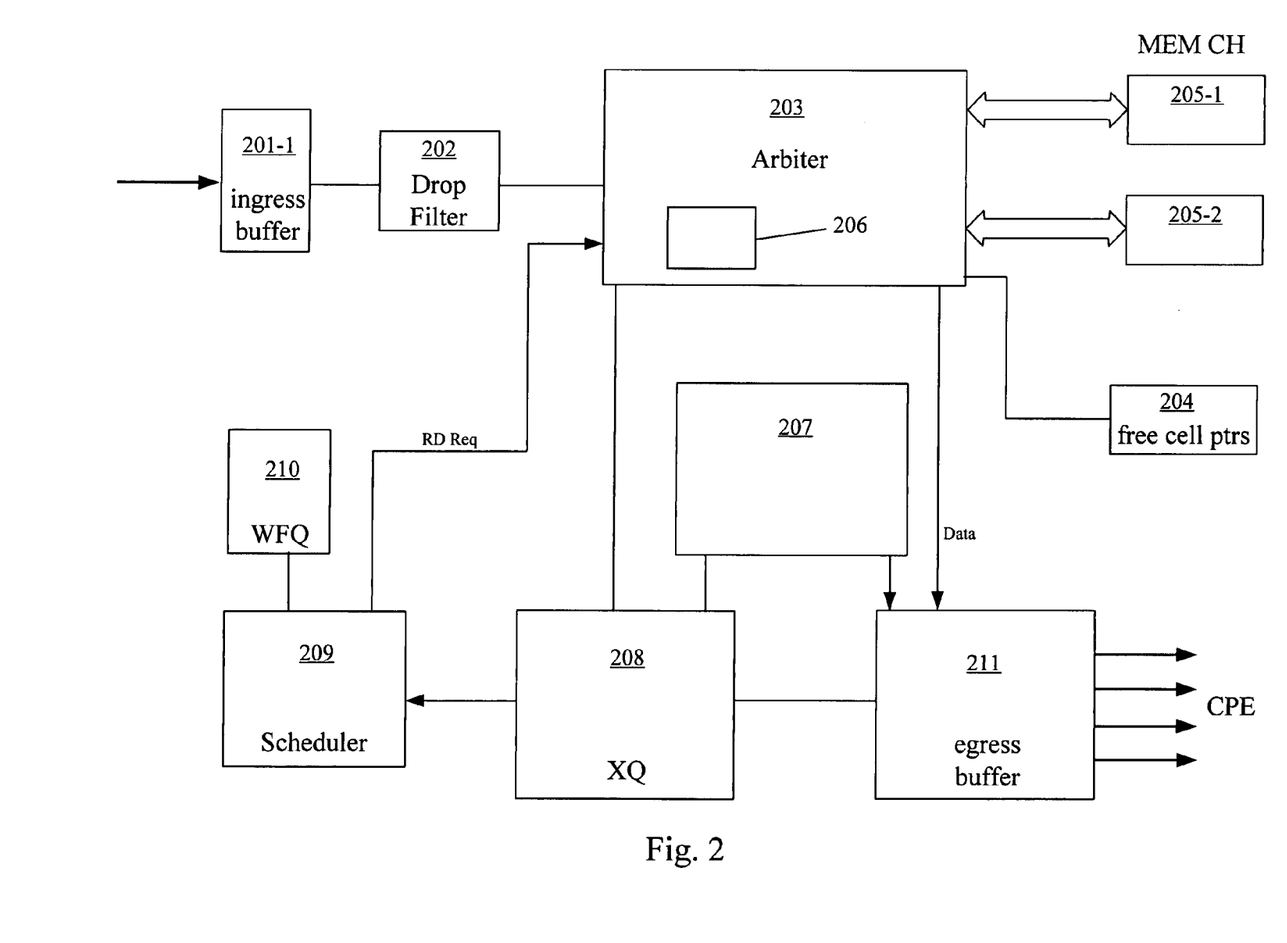
FIG. 2 provides a block diagram illustrating elements used to process packets by the network switch, according to one embodiment of the present invention.

Data passes from the ingress buffer 201-1, in FIG. 2, to a drop filter 202 that may drop the packet based on programmed criteria. The packet data then passes to an arbiter 203, that has its own random access memory 206. The arbiter controls access to the memory channels 205-1 and 205-2 where packet data is stored. The arbiter communicates with a free cell pointer module 204 that provides a pointer to the next available free cells in the memory. The arbiter also is in communication with the egress queue 208 and egress buffer 211 modules. The egress buffer receives the packet data when it is ready to be sent out on the CPE interface. The egress queue module is also in communication with a scheduler 209 that schedules which packets and in what order they are sent out. The scheduler also communicates with a weighted fair queue 210 module to assist in making scheduling decisions, where those decisions result in specific read requests being sent to the arbiter.

As discussed above, problems can occur with the DLL functioning when the memory has a higher throughput and detection and correction must occur at higher speeds. One such problem can occur in that the phase shift must be detected to determine if it is still 90 degrees. As time goes by, the voltages and settings in the network device may shift and other changes may occur. The DLL should react to its working environment and automatically change its settings accordingly. One issue is how often to update the slave DLLs. If the update were to occur at every clock cycle, the delay lines would have issues when changing from tap to the next tap. If the slave DLLs are not updated and reset before the next cycle, certain glitches may be introduced. In other words, things may not momentarily be set correctly. The glitches can potentially generate extra clock edges that would be very undesirable to the function of the device.

In order to avoid such issues, a single particular value need not be used and an intelligent process to determine the proper value may be employed. In addition, network device and its power supply respond dynamically to the core frequency of the assembly, but also respond to high and lower frequencies. DC ripple, occurring between 1 khz and 500 khz, can result in variations in voltages that effect the DLL. If the update of the slave DLLs occurs when ready and it takes in a value specific to that particular cycle and uses it for a certain number of cycles, there could other issues. If the value is not representative, i.e. updated with either a high or low value, then that can cause errors.

In order to address the above issues, the present invention acts to average the offset values to obtain a value that is representative to be used over many cycles. In certain embodiments of the present invention, the averaging occurs over 32 or 64 cycles. Thus, the averaging acts as a filter to provide values are that not representative of high or low frequency values, but rather are somewhere in the middle during the averaging time period.

This "ave" Block is added to the conventional DLL design to use a numerical method to determine the average setting during the interested period, i.e., 32 cycles or 64 cycles, etc. This, in fact, functions as a filter to "remove" the low-frequency power supply instability and its effect of DLL settings. In a DLL-DL system, where the DLL determines the setting, i.e., the number of taps the DL should use to set the delay, this "ave" block can provide a setting which is more stable. This block can be placed either in the DLL Block or in the DL block of the DLL-DL system.

Figure 3:
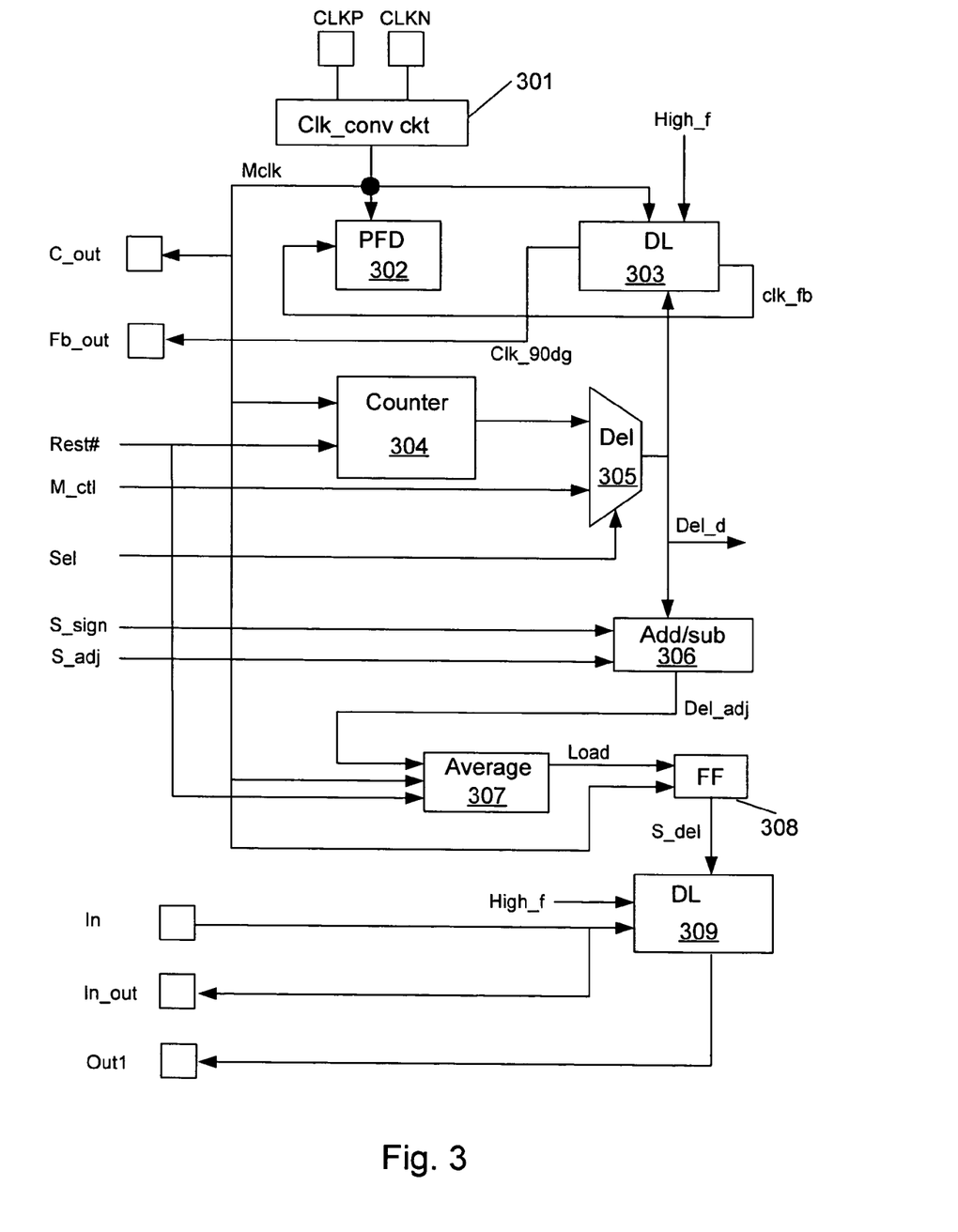
FIG. 3 provides a block diagram illustrating, according to one embodiment of the present invention.

FIG. 3 illustrates schematically a portion of DLL circuit according to one embodiment of the present invention. The clock signal is introduced at CLKP and CLKN and is converted by converter 301 into a master clock signal Mclk. The High_f input is used to tell the DLL whether it should be set up for high frequency operation. In some embodiments, this would be for frequencies above 200 Mhz. The master clock signal is output at C_out and input into the PFD module 302, the counter 304 and the averaging unit 307. The master clock is also input into the delay loop 303 which produces the 90 degree phase shifted signal. The S_sign and S_adj are used to signal the magnitude and polarity of the number of taps that should be shifted from the lock position, which is determined in the add/sub unit 306. The offset values are averaged 307 and the delay shift is forwarded by a forwarding unit 308 to the slave DLLs 309, with a value S_del that stipulates the amount of offset. Thereafter, the slave delay line receives an input In and the proper delay is applied.

Figure 4:
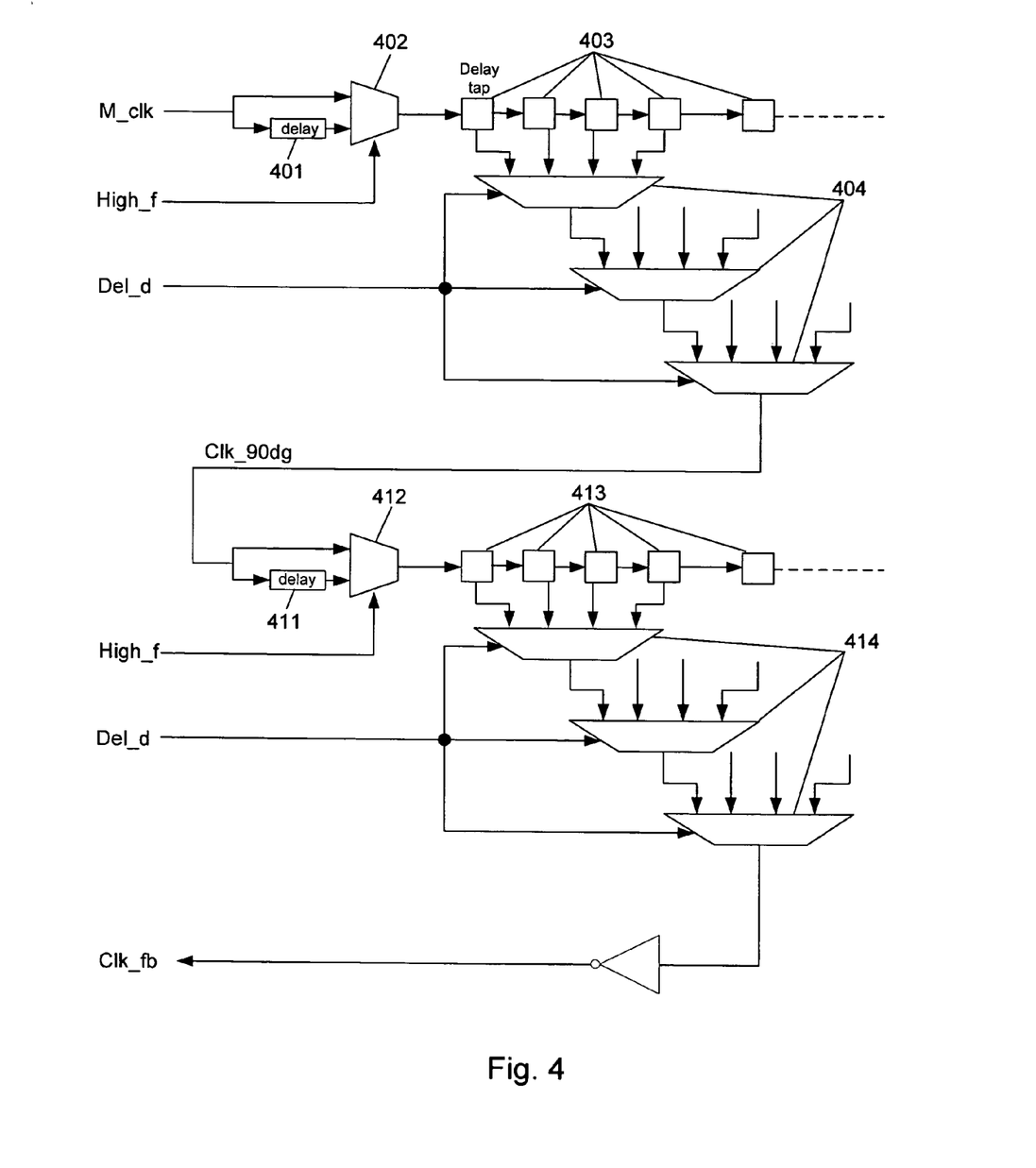
FIG. 4 provides a block diagram illustrating, according to one embodiment of the present invention.

FIG. 4 illustrates schematically another portion of the DLL circuit according to one embodiment of the present invention. The master clock signal, M_clk, is provided as an input, where a portion of the signal is delayed through a delay module 401. It is determined whether the DLL is operating in a high frequency mode, where the proper signal is then fed to the delay taps 403. The DLL output setting, Del_d, obtained as a result of the portion illustrated in FIG. 3 is used to select to modulate 404 the clock signal to produce the 90 degree shifted clock signal. Thereafter, the process is replicated with similar modules, 411–414, to produce the 90 degree phase shifted master clock.

Figure 5:
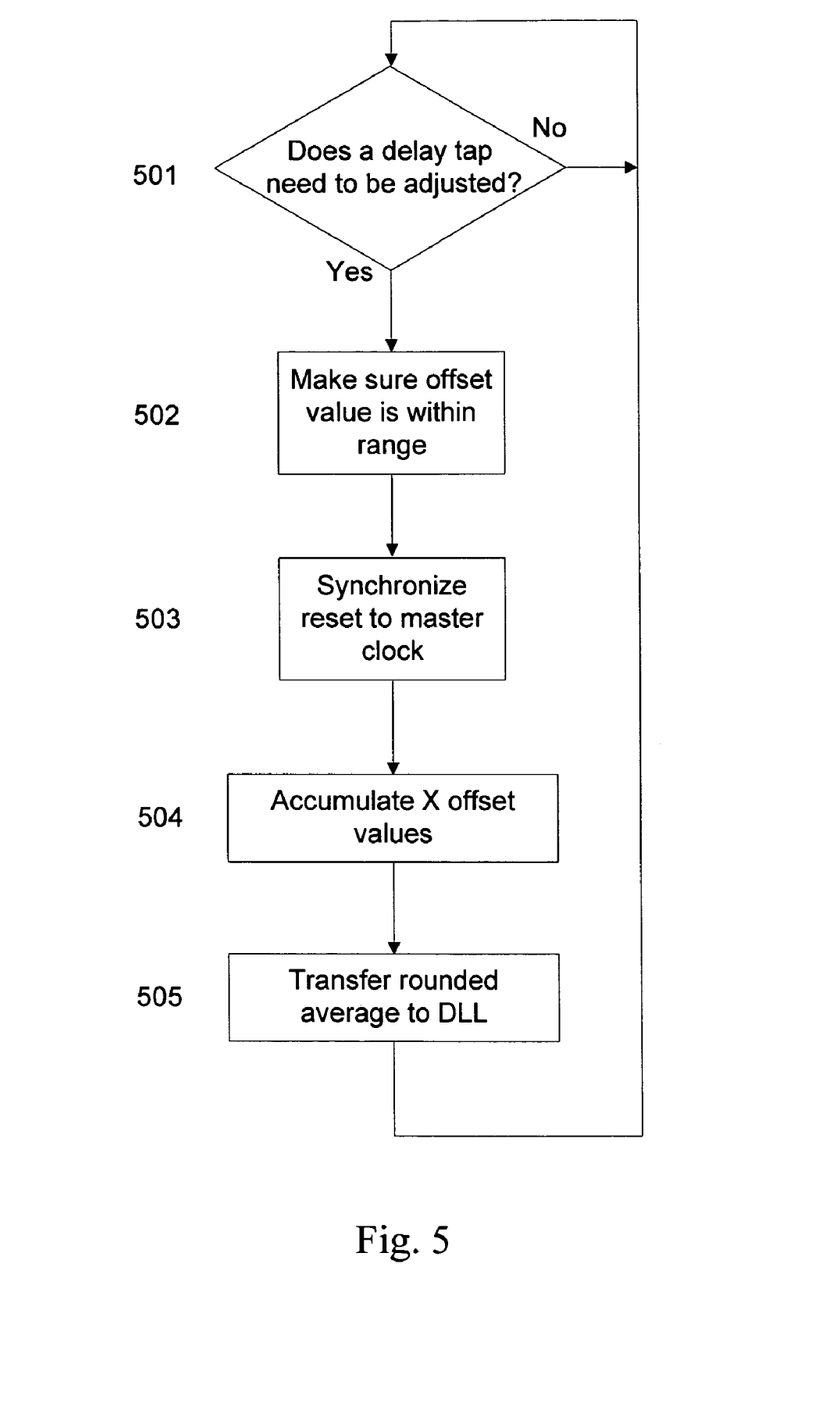
FIG. 5 illustrates a flow chart showing the process of averaging the delay forwarded to the DLL, according to one embodiment of the present invention.

The method of the present invention, according to certain embodiments of the present invention, is illustrated in FIG. 5. In step 501, it is determined whether the delay tap needs to be adjusted. If it needs to be adjusted, then it is determined whether the offset value is within range, step 502, and the reset is synchronized to the master clock, in step 503. Thereafter, a predetermined number of offset values are accumulated, in step 504, and the rounded average is sent to the slave DLLs, in step 505. It should be note that the process of obtaining an optimal setting value can take place in either the master DLL or in the slave DLLs.

The above-discussed configurations of the invention are made with respect to a delay-locked loop (DLL) module, where such a module may be utilized in a network device, such as a network switch. Such a module may be used in memory circuits, such a SRAM, DRAM and non-volatile memory. A DLL module, according to the instant invention, may be used in embedded control systems, programmable arrays or central processing units. Such a DLL module may be used in all types of semiconductor chips and in non-analog chips. The instant invention may also be used in any application where a clock needs to be shifted, inverted, locked or corrected. Such listed uses of a DLL module are not exhaustive and should be taken merely as examples.

The above-discussed configuration of the invention is, in a preferred embodiment, embodied on a semiconductor substrate, such as silicon, with appropriate semiconductor manufacturing techniques and based upon a circuit layout which would, based upon the embodiments discussed above, be apparent to those skilled in the art. A person of skill in the art with respect to semiconductor design and manufacturing would be able to implement the various modules, interfaces, and tables, buffers, etc. of the present invention onto a single semiconductor substrate, based upon the architectural description discussed above. It would also be within the scope of the invention to implement the disclosed elements of the invention in discrete electronic components, thereby taking advantage of the functional aspects of the invention without maximizing the advantages through the use of a single semiconductor substrate.

Although the invention has been described based upon these preferred embodiments, it would be apparent to those skilled in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method of setting a delay offset in slave Delay-Locked Loop (DLL) modules by a master DLL module, said method comprising:
   determining whether a delay tap value needs to be adjusted based on a comparison with a reference clock signal;
   calculating a delay offset value to correct the delay tap value;
   repeating the determining and calculating steps a predetermined number of times over a provided number of clock cycles of the reference clock signal; and
   forwarding a representative value of the calculated delay offset values;
   wherein the representative value is determined through a comparison between all of the calculated delay offset values obtained in the repeating step by averaging all of the calculated delay offset values during the provided number of clock cycles.

2. A method as recited in claim 1, wherein the provided number of clock cycles comprises at least 32 clock cycles.

3. A method as recited in claim 2, wherein the provided number of clock cycles comprises 64 clock cycles.

4. A method as recited in claim 1, wherein the step of repeating the determining and calculating steps is performed a sufficient number of times to remove effects of low frequency power supply instability from the representative value.

5. A method as recited in claim 4, wherein the determining, calculating and repeating steps are performed in the slave DLL modules after the step of forwarding the representative value.

6. A delay offset module for setting a delay offset in slave Delay-Locked Loop (DLL) modules by a master DLL module, said module comprising:
   determining means for determining whether a delay tap value needs to be adjusted based on a comparison with a reference clock signal;
   calculating means for calculating a delay offset value to correct the delay tap value;
   timing means for measuring a predetermined time period comprising a provided number of clock cycles of the reference clock signal;
   holding means for holding multiple calculated delay offset values determined by the calculating means over the predetermined time period;

representative means for obtaining a representative value of the held calculated delay offset values, wherein the representative value is obtained by the representative means by averaging all of the held calculated delay offset values during the provided number of clock cycles; and forwarding means for forwarding the representative value.

7. A module as recited in claim 6, wherein the provided number of clock cycles comprises at least 32 clock cycles.

8. A module as recited in claim 7, wherein the provided number of clock cycles comprises 64 clock cycles.

9. A module as recited in claim 6, wherein the predetermined time period comprises a sufficient length of time to remove effects of low frequency power supply instability from the representative value.

10. A module as recited in claim 6, wherein the calculating, timing, holding and representative means are contained in each of the slave DLL modules.

11. A delay offset module for setting a delay offset in slave Delay-Locked Loop (DLL) modules by a master DLL module, said module comprising:

an adjustment determiner for determining whether a delay tap value needs to be adjusted based on a comparison with a reference clock signal;

a calculating means for calculating a delay offset value to correct the delay tap value;

a timer for measuring a predetermined time period, the predetermined time period comprising a provided number of clock cycles of the reference clock signal;

a holding memory for holding multiple calculated delay offset values determined by the calculating means over the predetermined time period;

a representative value calculator for obtaining a representative value of the held calculated delay offset values, wherein the representative value is obtained by the representative value calculator by averaging all of the held calculated delay offset values during the provided number of clock cycles; and a forwarder for forwarding the representative value.

12. A module as recited in claim 11, wherein the provided number of clock cycles comprises at least 32 clock cycles.

13. A module as recited in claim 12, wherein the provided number of clock cycles comprises 64 clock cycles.

14. A module as recited in claim 11, wherein the predetermined time period comprises a sufficient length of time to remove effects of low frequency power supply instability from the representative value.

15. A module as recited in claim 11, wherein the calculator, the timer, the holding memory, the representative value calculator are contained in each of the slave DLL modules.

* * * * *